Dec. 5, 1967 J. J. PAKAN 3,356,971
TUNED CIRCUIT
Filed Nov. 14, 1951 4 Sheets-Sheet 1

INVENTOR.
JOHN J. PAKAN
BY
Marshall A. Burmeister
ATTORNEY

INVENTOR.
John J. Pakan
BY
Marshall A. Burmeister
Attorney.

INVENTOR.
John J. Pakan
BY
Marshall A. Burmeister
Attorney.

INVENTOR.
John J. Pakan
BY
Marshall A. Burmeister
Attorney.

United States Patent Office 3,356,971
Patented Dec. 5, 1967

3,356,971

TUNED CIRCUIT

John J. Pakan, Oak Park, Ill., assignor to A.R.F. Products, River Forest, Ill., a corporation of Illinois Filed Nov. 14, 1951, Ser. No. 256,303
23 Claims. (Cl. 333—82)

The present invention relates to tuned resonant electrical circuits, and more specifically to tuned resonant circuits that are adapted for use in devices operating at frequencies above 500 megacycles.

The object of this invention is to provide tuned circuits having the following characteristics and attributes:

(a) The circuits are to be tunable over a continuous wide frequency band, the end frequencies having a ratio at least of the order of 2 to 1;

(b) The circuits are to be tunable by rotation rather than by translation;

(c) The circuits are to be constructed with a desired relationship between resonant frequency and angular position of the tuning control when used with a direct mechanical drive without cams, specifically, the circuits are to have a linear relationship between frequency and angular displacement of the tuning control;

(d) The circuits are to be suitable for use passively, i.e. not associated with vacuum tubes, or in conjunction with a vacuum tube, as in an oscillator;

(e) The circuits are to be provided with tracking means for adjustment of the relationship between frequency and angular displacement of the tuning control so that several circuits may be ganged without resort to adjustable mechanical cams or tracks;

(f) The circuits are to be suitable for rapid tuning throughout their entire frequency band by continuous rotation of the tuning control, the entire band being covered over a portion of each rotation; and (g) The circuits are to be suitable for use in applications in which no mechanical contact is permissible between those conducting parts of the tuned circuit which are movable with respect to each other.

In one of the embodiments of the invention, the circuits have a linear frequency to tuning position relationship with the additional advantage that the minimum spacing between conducting parts of the circuit is independent of the frequency to which the circuit is tuned within its frequency band, so that the mechanical tolerance requirements and the criticalness of tuning adjustments are independent of frequency. Furthermore, this minimum spacing is sufficiently large to permit achievement of very stable frequency characteristics for the circuits without imposing construction difficulties due to the mechanical accuracy required.

The present invention is based upon the resonant properties of short lengths of coaxial transmission lines with non-dissipative terminations, and upon the variation of this resonant frequency by varying the characteristic impedance of portions of such coaxial lines. As is well known in the art, resonant transmission line circuits have multiple resonances. In the devices of the subject invention, any particular mode of resonance may be chosen to tune over the required band of frequencies, the selection of this mode being made in each construction to most easily achieve the requirements of contactless design, application of D.C. potentials, overall size, or other design requirements.

FIGURES 1 through 9 will aid in obtaining an understanding of the invention, in which:

Figures 1, 2:
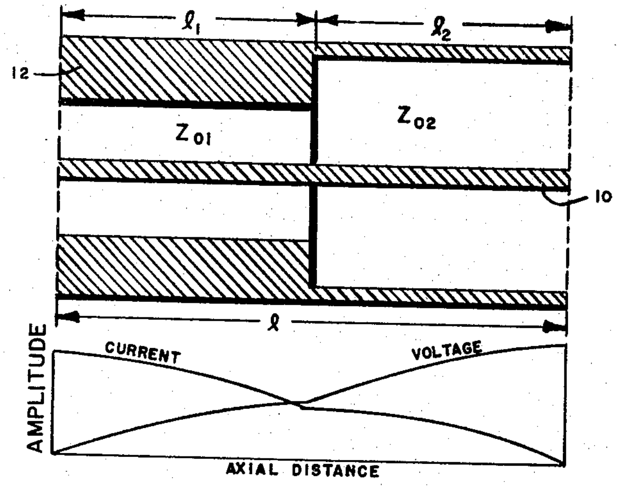
FIGURE 1 is a schematic diagram of a transmission line resonant circuit showing an electrical section composed of segments having different characteristic impedances, the term "section" being used as a portion of a transmission line between a point of maximum standing wave current in the conductors and an adjacent point of maximum standing wave voltage between the conductors.
FIGURE 2 is a graph of the standing wave voltage and current distributions along the length of the transmission line shown in FIGURE 1.
Figure 3:
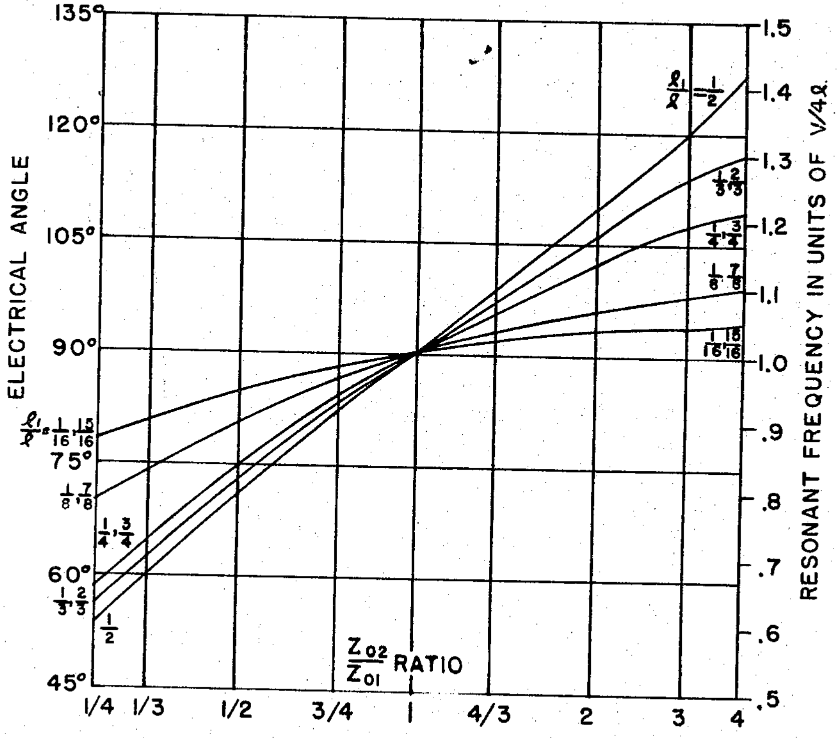
Figure 6:
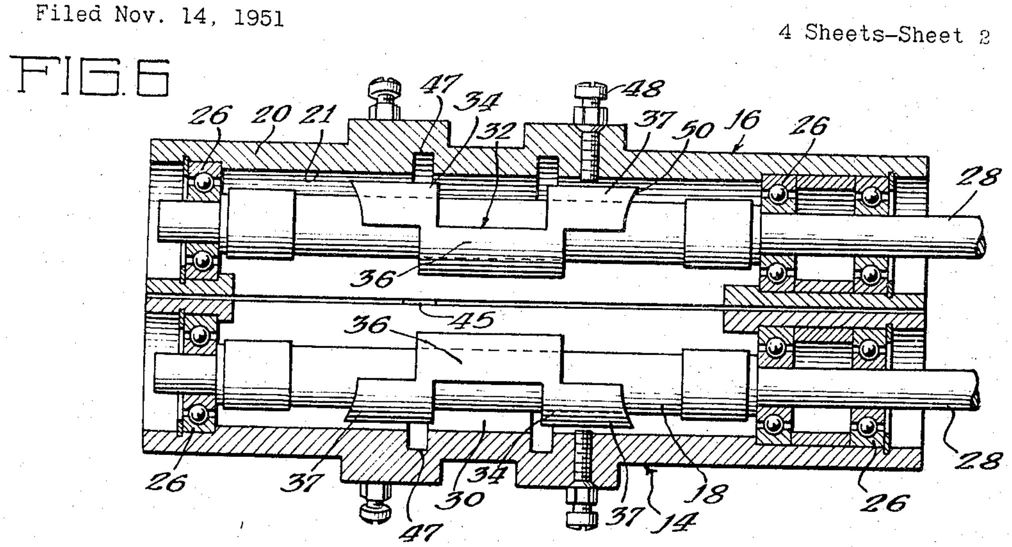
Figure 4:
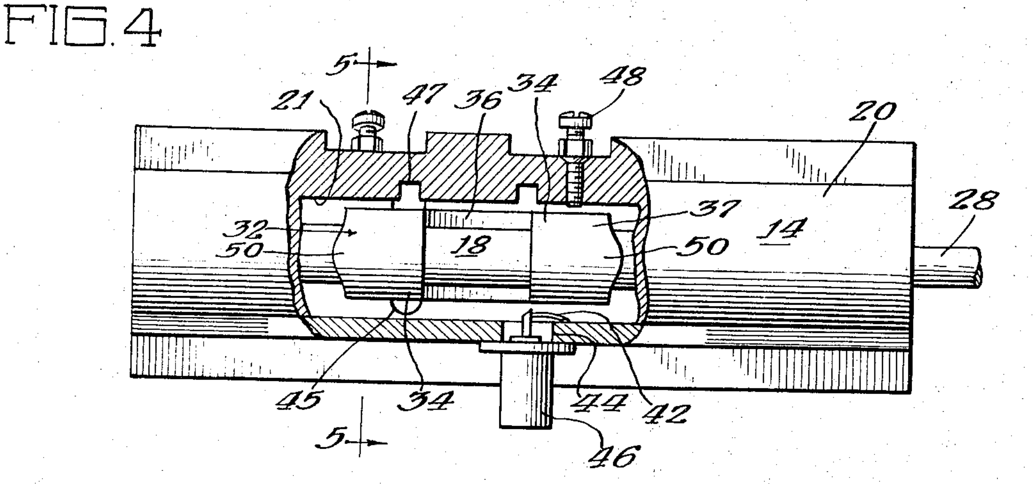
Figure 5:
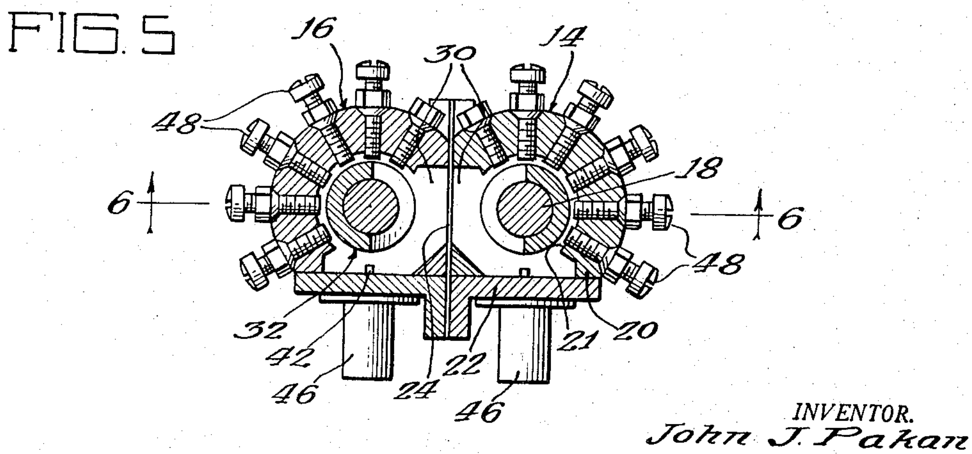
Figure 7:
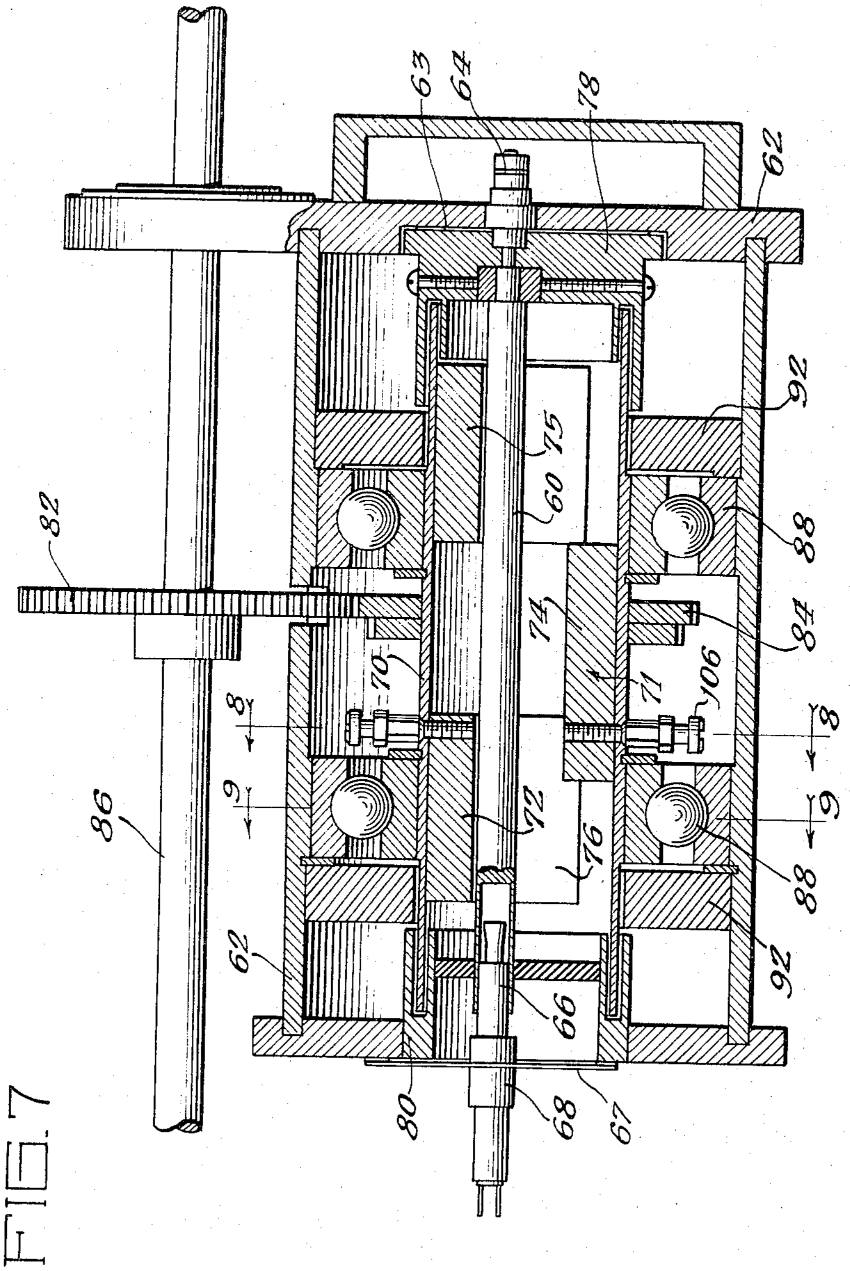
Figure 8:
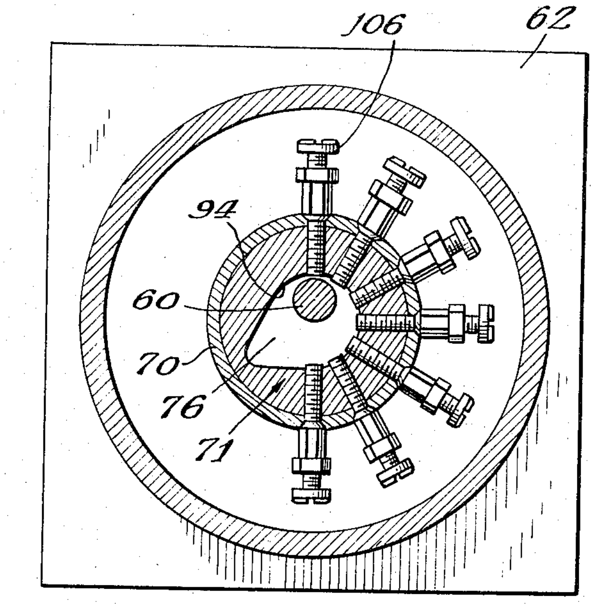
Figure 9:
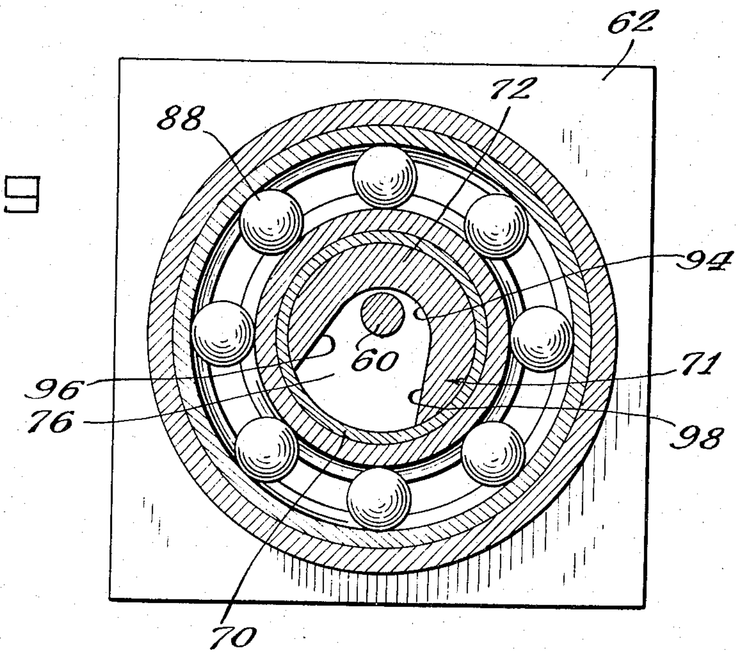

FIGURE 3 is a graph showing the relation of the ratio of the characteristic impedances of the transmission line segments to frequency of resonance for a section of fixed overall length, such as that of FIGURE 1, the ratios of characteristic impedances being plotted as the abscissa with a scale such that equal increments thereon correspond to equal but opposite increments in the characteristic impedance of each of the segments, and the ordinant being labeled both in terms of resonant frequency and angular electrical length, the latter being defined as 360 degrees multiplied by the length of the transmission line and divided by the wavelength of the resonant frequency;

FIGURES 4 through 6 are views of one embodiment of the invention showing two resonant circuits, FIGURE 4 being an elevational view partly cut away and in section, FIGURE 5 being a transverse sectional view taken along lines 5—5 of FIGURE 4, and FIGURE 6 being a longitudinal sectional view taken along line 6—6 of FIGURE 5; and FIGURES 7 through 9 are views of another embodiment of the invention showing a resonant circuit adapted for use with a vacuum tube, which is also illustrated, FIGURE 7 being a longitudinal sectional view of the circuit, FIGURE 8 being a transverse sectional view taken along line 8—8 of FIGURE 7, and FIGURE 9 being a transverse sectional view taken along line 9—9 of FIGURE 7.

FIGURE 1 shows schematically a portion of a resonant transmission line of length $l$ so excited that the length $l$ corresponds to an electrical section, as previously defined. The transmission line is composed of one electrically conducting element 10 disposed within another electrically conducting element 12. The overall length $l$ is divided into two lengths $l$, and $l_2$ having different characteristic impedances, symbols $Zo$, and $Zo_2$ being used to designate these impedances.

FIGURE 2 shows the voltage and current distributions of the standing wave which are set up in the resonant circuit of FIGURE 1 by the excitation. As shown, these curves are made up of sinusoidally shaped segments satisfying the following mathematical relationships at the transition point from characteristic impedance $Zo$ to $Z_2$:

$$I = \text{Imax} \cos \beta l_1 = \frac{\text{Vmax} \sin \beta l_2}{Zo_2} \qquad \text{(Eq. 1)}$$

$$V = Zo_1 \text{ Imax} \sin \beta l_1 = \text{Vmax} \cos \beta l_2 \qquad \text{(Eq. 2)}$$

where $\beta$ is equal to $2\pi$ divided by the wavelength $\lambda$, Imax is the current amplitude at its maximum point, and Vmax is the voltage amplitude at its maximum point. Due to the definition of an electrical section, these maxima occur at the ends of the portion of the circuit shown in FIGURE 1. Dividing Equation 1 by Equation 2, it is clear that $$\frac{Zo_2}{Zo_1} = \tan \beta l, \tan \beta l_2$$

This equation for the ratio of characteristic impedances of the two sections of the line, shown schematically in FIGURE 1, has been derived assuming that the current and voltage do not change at the point of discontinuity from $Zo_1$ to $Zo_2$. In other words, the discontinuity capacity effects have been neglected in order to simplify the calculations.

If a particular ratio of $l_1/l$ is chosen, the above equation may be solved in terms of the ratio of $Zo_2/Zo_1$ and the electrical angle, $\beta l/_2$. A graph of such solutions for different ratios of $l_1/l$ appears in FIGURE 3. The amount by which $\beta l$ differs from a quarter wavelength is the difference between the 90 degree ordinate and the point on the curve corresponding to the given set of conditions under consideration, shown in electrical degrees. Since $l$ has been fixed by the boundry conditions to be a constant and $\beta$ is directly proportional to frequency, the ordinate may be read directly in terms of the frequency of the excitation necessary to satisfy the boundary conditions of the section, the 90 degree ordinate having been set equal to the frequency of $v/4l$, $v_{10}$ being the velocity of wave propogation and equal to $3\times 10$ cm./sec.

It is clear from the graph in FIGURE 3, that if a means is provided to vary the ratio of $Zo_2$ to $Zo_1$ by displacing a tuning element within the circuit, then the ratio $l_1/l=\frac{1}{2}$ will cover the greatest frequency range for a given range of variation of $Zo_1$ and $Zo_2$, and will produce the most linear tuning characteristic if $Zo_1$ and $Zo_2$ are linear functions of the tuning element displacement.

The embodiment of the invention shown in FIGURES 4 through 6 comprises two resonant circuits, each composed of two electrical sections which are electrically coupled together. The two circuits are also adapted to be mechanically geared to each other and tracked to cover a frequency band synchronously. Each of the circuits is provided with an imput coupling means and an output coupling means, and since the two circuits are electrically coupled together they may be used as a preselector or narrow band filter.

Two sections may be used in each circuit and will permit physical realization of the boundry conditions. Each circuit may be formed by a transmission line open circuited at both ends and having an inner conducting element mounted upon a rotatable insulating rod within an outer conducting element. By this construction, voltage maxima will develop at each end of the circuit, when the circuit is excited by an R.F. source of the desired resonant frequency, thus meeting the requirement of object (g) without resort to complicated contactless connection design. When such a circuit is excited by an A.C. source at the desired resonant frequency, a current maximum will exist at the center of the transmission line structure and be common to both sections.

To utilize the tuning characteristic of structures having variable $Zo$ segments, as previously discussed, each section has two variable $Zo$ segments of approximately equal length, so designed that rotation of the inner element results in increasing the characteristic impedance of one of the segments and decreasing that of the other. In this circuit a current maximum occurs at the center of one of the variable characteristic impedance segments of the transmission line and is common to both of the electrical sections. For this reason, this variable characteristic impedance segment is approximately twice as long as the other two variable characteristic impedance segments that are disposed at opposite ends of the longer segment and complete the two sections.

Since coupling to a circuit, or between circuits, would be difficult if the entire circuit were composed of variable characteristic impedance segments due to impedance variations at the point of coupling, the variable characteristic impedance segments are separated by short lengths of constant characteristic impedance segments in order to provide a suitable place to introduce the coupling network. The characteristic impedance of the constant impedance segment may be chosen to facilitate this coupling without greatly affecting the tuning characteristics which would be achieved in a circuit which does not have constant impedance segments, provided the constant impedance segment is located at the center of the electrical section and is short compared to the length of the variable characteristic impedance sections on either side.

The realization of the variable characteristic impedance segments is based upon the fact that the characteristic impedance of a transmission line is inversely proportional to the capacity per unit length of the line (if the conditions for constant velocity of wave propogation are satisfied, as they are here), so that varying the capacity per unit length varies the characteristic impedance. As brought out in FIGURE 3, a linear variation of the characteristic impedances of the variable impedance segments yields a quite linear frequency characteristic for equal length segments. Since FIGURE 3 is plotted with the abscissa scale chosen so that equal increments on the scale correspond to equal increments in the characteristic impedance of each segment, if the characteristic impedance of each segment is an inverse function of the linear per unit capacity functions, then the ratios of the characteristic impedances of the abscissa may be replaced by capacity ratios. Hence, linear per unit capacity increments in both of the variable impedance segments also correspond to equal frequency increments.

A linear capacity variation may be achieved by rotating one semicylindrical electrically conducting surface which is mounted coaxially with a similar surface having a larger radius. The size of the confronting areas of the two surfaces is then a function proportional to the angular position of rotation of the rotatable surface, and hence the capacity between the surfaces will also be proportional to the angular position of the rotatable surface.

In order to make the transmission line coaxial, the larger of the conducting surfaces may be completed around the smaller conducting surface at a radial distance greater than the radius of its semicylindrical portion, so that the capacity will still largely be a function of the angular position of the rotatable surface.

FIGURES 4 through 6 illustrate tuned circuits which operate in the manner described above. In general, the figures show two such tuned circuits 14 and 16 which are coupled together and adapted to be tracked to each other over their useful frequency range. The inner conducting surfaces are formed by electrically conducting shells 32 mounted upon electrically insulating rods 18. The ends of the rods 18 are affixed to shafts 28 of mechanically durable material, and the shafts 28 are rotatably mounted to the outer conductor by means of bearings 26.

Each of the outer conductors consists of an electrically conducting housing 20 with a semicylindrical inner surface 21, a flat electrically conducting base 22, and an electrically conducting plate 24 which is common to the two circuts. The base 22 and the plate 24 are at right angles to each other and form a unitary structure with the housing 20. A cavity 30 is thus formed within each outer conductor.

The three variable characteristic impedance segments of each transmission line circuit may be identified with the semicylindrical portions of the inner conductors labeled 36 and 37, and the constant characteristic impedance segments with the cylindrical portions labeled 34. Coupling loops 42 are mounted adjacent to the cylindrical portions 34 of the shell 32. An orifice 44 through the base 22 permits one end of the loop 42 to extend to the exterior of the cavity 30, where it is connected to a connector 46 for a concentric cable of any well known type. The other end of the loop 42 is connected to the base 22, as by a solder connection. Grooves 47 are disposed in the housing adjacent to the cylindrical portions 34 of the shell 32 in order to increase the impedance of these constant characteristic impedance segments, and to simplify matching this impedance to the device to be coupled into the circuit by connector 46.

The tuned circuits 14 and 16 may be coupled together by an aperture 45 in the plate 24 positioned on a line between one of the cylindrical portions 34 of each of the conducting shells 32.

Due to the introduction of the constant characteristic impedance segments and second order effects not considered in the calculations, it is generally desirable to provide some means for adjusting the relation between tuning position and frequency of the tuned circuits. For this reason, a number of tracking screws 48 have been threaded through the housing 20 at points approximately adjacent to the ends of the short semicylindrical portions 37 of the conducting shell 32, because the voltage is a maximum at this point in an open ended resonant circuit, and the tracking screws 48 will produce the greatest tuning effect. These have the effect of permitting readjustment of the distance between the short portions 37 of the shell 32 and the housing 20 in localized areas, thus varying the characteristic impedance slightly. Also the ends 50 of the short portions 37 of the shell 32 have been shaped irregularily for the same purpose. The exact shape of these ends 50 is determined experimentally, and will differ with each particular construction.

In a particular construction of the described tuned circuit for covering the range of frequencies between 1830 and 2750 megacycles, the distance between the conducting shell 32 and the surface 21 of the semicylindrical housing is 0.045 inch, the radius of the inner surface 21 of the semicylindrical housing is 0.750 inch, the radius of the outer surface of the conducting shell 32 is 0.660 inch, the shortest distance from the conducting shell 32 to the base 22 or plate 24 is 0.220 inch, the length of the short semicylindrical portions 37 is 0.360 inch, the length of the long semicylindrical portions 36 is 0.814 inch, and the axial length of the cylindrical portions 34 is 0.130 inch. The grooves 47 have a width of 0.160 inch and a depth of 0.160 inch.

The second embodiment of the invention comprises a tuned circuit particularly designed for use with a vacuum tube. As illustrated in FIGURES 7 through 9, it is the resonant plate circuit of an oscillator, and is shown connected between the plate 66 and cathode 67 of a vacuum tube 68. A similar circuit, not shown, is connected between the grid and cathode of the vacuum tube 68, and the two circuits may be tracked to synchronously tune the same frequency range by suitable mechanical means.

The circuit consists of five electrical sections. Commencing from the tube end of the structure, the first section is a constant characteristic impedance section and is physically shortened to compensate for the tube capacity. The second section includes a fixed characteristic impedance portion and a variable characteristic impedance portion. The third and fourth sections each include portions of two variable characteristic impedance portions of the circuit, and the fifth section comprises a variable characteristic impedance portion and a fixed characteristic impedance portion which terminates in a short circuit. It is to be understood that the boundries between sections are only an electrical phenomena and are not defined in terms of the mechanical structure, and that there are only three variable characteristic impedance portions in the physical structure which supply the six variable characteristic impedance segments described above.

The use of a plurality of variable characteristic impedance sections achieves a cumulative tuning effect which decreases the required range of characteristic impedance variation required to cover a given frequency range. The nature of this cumulative tuning effect may be appreciated from the following considerations.

It has been shown in the discussion of FIGURES 1 through 3, that if the frequency of excitation is increased, for example, and the characteristic impedance of the segments within the section varied appropriately, the circuits may remain resonant even though the section length is held constant. However, if the ratio of the characteristic impedances of the segments is varied more than is required to maintain the constant section length, the section length will increase as the excitation frequency is increased and the characteristic impedances varied. If one of the boundries of the section is fixed, this change in section length moves the boundry of the adjacent section. In like manner, the adjacent section may also be operated to increase in length when the excitation frequency is increased, so that the tuning effect becomes cumulative.

In this embodiment of the invention, the cumulative tuning effect results in translating the current maximum of the standing wave which defines the first section along the transmission line, this section comprising the tube reactance and a constant characteristic impedance portion. Hence, increasing the excitation frequency moves this current maximum toward the vacuum tube, thus meeting the requirement for tuning a coaxial transmission line terminating in a vacuum tube just as though this boundry were determined by a movable plunger short circuiting the transmission line.

This cumulative tuning effect is only useful in reducing the characteristic impedance variation required to cover a given frequency range where the circuit contains lumped reactances or fixed characteristic impedance portions of the transmission line, and thus was not of value in the first embodiment.

It will be noted that the section boundries vary in location along the transmission line in this embodiment. For this reason, the variable characteristic impedance segments of the circuit have been disposed at points to produce the maximum effect at their position of lowest characteristic impedance, and thus the variable characteristic impedance segments do not bear the exact adjacent relationship of the first embodiment.

As illustrated in the drawings, the inner element of the transmission line is constructed in the form of a cylindrical electrically conducting rod 60 which is securely affixed to a housing 62. A terminal 64 at one end of the rod 60 may be used to connect a D.C. potential source to the rod 60, and the other end of the rod 60 is connected to the plate 66 of vacuum tube 68. A mica disc 63 between the housing 62 and the terminal 64 electrically insulates these parts of the structure. In this manner, D.C. power may be applied to the plate 66 of vacuum tube 68 through the rod 60.

The outer element of the transmission line consists of a hollow cylinder 70, stationary portions 78 and 80, a cylindrical tuning element 71 having two portions 72 and 74, and tuning element 75 which provide the desired electrical characteristics. A cavity 76 extends through the cylindrical elements 71 and 75, and the rod 60 traverses this cavity 76.

As stated above, this circuit consists of five electrical sections. Adjacent to the tube 68 is a constant impedance section formed by the stationary portion 80 and the rod 60. The next electrical section includes a constant impedance portion which physically constitutes the stationary portion 80, the cylinder 70, and the rod 60, and a variable impedance portion comprising the rod 60, cylinder 70, and a part of the portion 72 of the cylindrical tuning element 71.

As shown in FIGURE 9, the cavity 76 extends through to the periphery of the cylindrical element 71 in this portion 72, and has two essentially flat surfaces 96 and 98 extending into the element 71 from the periphery thereof, these surfaces being joined by a curved surface 94.

Also as set forth above, the next two electrical sections each have two variable impedance portions. The next adjacent electrical section consists of rod 60 and an outer conductor including the cylinder 70, a part of portion 72 of tuning element 71, and a part of portion 74 of tuning element 71. The following electrical section comprises the rod 60 and an outer conductor including cylinder 70, a part of portion 74 of element 71, and a part of tuning element 75.

Tuning element 75 is constructed in the same manner as the portion 72 of element 71, described above. Portion 74 of element 71 is also similarly constructed, except that the curved surface 94 of portion 74 is on the opposite side of rod 60 from that of portion 72 and element 75. Also, portions 72 and 74 overlap, as shown in FIGURE 8, the curved surface 94 being a continuation of the curved surface of portion 72.

The final electrical section comprises a variable impedance portion including the rod 60 and an outer conductor comprising a part of element 75, and a constant impedance portion comprising the rod 60 and an outer conductor including cylinder 70 and stationary portion 78.

A gear 84 is securely attached about the periphery of the center portion of the cylinder 70 and is meshed with gear 82 in order to rotate the cylinder 70 relative to the housing 62. Ball bearings 88 are disposed between the housing 62 and the cylinder 70 along the length of the cylinder 70 to assure smooth rotation of the cylinder with respect to the housing 62.

Contactless R.F. connections are disposed between the housing 62 and the rotating cylinder 70. Each of these connections consists of a first transmission line segment disposed at the end of the cylinder 70 followed by a second transmission line segment and in series with a wave absorber 90 or 92 affixed to the housing 62. The first segments are formed between the cylinder 70 and stationary portions 78 and 80 of the outer conductor for the tuned circuit and exhibit low impedances at the ends of the cylinder 70 and high impedances adjacent to the wave absorbers 92. The second segments are formed between the housing 62 and the stationary portions 78 and 80 of the outer conductor and exhibit high characteristic impedances adjacent to the wave absorbers 92 and low characteristic impedances in the housing 62 adjacent to the ends of the stationary portions 78 and 80 of the outer conductor and exhibit high characteristic impedances adjacent to the wave absorbers 92 and low characteristic impedances in the housing 62 adjacent to the ends of the stationary portions 78 and 80 of the outer conductor.

The tuning elements 71 and 75 are shaped to produce the desired electrical characteristics for the resonant circuit. The cavity 76 within the tuning elements 71 and 75 has semicylindrical surfaces 94 with an axes of revolution eccentrically disposed with respect to the axis of the cylinder 70. The rod 60, which is the inner electrode of the transmission line, is also mounted eccentrically with respect to the cylinder 70.

As stated above, a radial segment is removed from each of the tuning elements 71 and 75 leaving flat surfaces 96 and 98 extending from the semicylindrical surfaces 94 to the periphery of the tuning elements. Since the shaft 60 is mounted eccentrically within the cylinder 70 and within the semicylindrical surfaces 94 of the tuning elements, rotation of the cylinder 70 varies the minimum distance between the shaft 60 and the tuning elements 71 and 75.

Tracking screws 106 are threaded through tuning element 71 in the region of overlap of portions 72 and 74, and the adjacent portion of the cylinder 70, so that the ends of the screws 106 may be positioned adjacent to the rod 60. As in the case of the circuit shown in FIGURES 4 through 6, the tracking screws may be adjusted closer to the rod 60 to decrease the characteristic impedance of a localized portion of the transmission line, and thereby correct errors in the desired linear characteristic of frequency to angular tuning position of the cylinder 70.

Because of the eccentric mounting of the rod 60 and the surfaces 94 of the tuning elements 71 and 75 within the cylinder 70, rotation of the cylinder 70 within the housing 62, changes the eccentricity of the rod with respect to the outer conductor surface defined by these tuning elements, and hence varies the characteristic impedance of these segments of the line.

A relatively high resonant impedance as required for use with a vacuum tube may be achieved with a circuit of the type described in this last embodiment more readily than with a circuit of the type previously described. A relatively small diameter rod 60 may be used as the center conductor resulting in higher characteristic impedances and consequently a higher resonant impedance.

It has been found that rod 60 may be a cylindrical 1/4 inch silver plated brass rod, and the inner diameter of the cylinder 70 may be 1.390 inches. The radius of the semicylindrical surfaces 94 of the tuning elements 71 and 75 may be 0.424 inch, and the rod 60 is mounted 0.147 inch from the axis of the cylinder 70. The circuit constructed with the above dimensions was found to resonate from 1450 mc. to 2300 mc. with a linear characteristic of frequency vs. rotation over a 150° rotation of the outer conductor, the length of portion 72 of element 71 and element 75 being 1.360 inches and that portion 74 of element 71 being 1.710 inches, the circuit being operated at the 5/4 wavelength mode.

The man skilled in the art will readily devise many modifications and other devices from knowledge obtained from the foregoing description. For this reason, it is intended that the scope of the invention be limited only by the following claims.

The following claims set forth what is claimed:

1. An electrical tuned circuit comprising a transmission line of fixed length including a first electrically conducting element with an elongated cavity therein and a second electrically conducting element rotatably mounted within the cavity, rotation of one of the elements with respect to the other element increasing the capacity per unit length between the elements in one portion of the transmission line and decreasing the capacity per unit length between the elements in another portion of the transmission line, thereby simultaneously changing the characteristic impedance in opposite directions in different portions of the transmission line, and non-dissipative termination means disposed at the ends of the transmission line.

2. An electrical tuned circuit comprising, in combination, a transmission line of fixed length including a first electrically conducting element provided with an elongated cavity therein and a second electrically conducting element rotatably mounted within the cavity, at least two portions of said line being of equal length, means to increase the characteristic impedance of one of said portions and simultaneously decrease the characteristic impedance of the other of said portions by rotating one of the elements with respect to the other, and non-dissipative termination means disposed at each end of the transmission line, whereby a radio frequency wave within a relatively wide range of frequencies may be resonated in said circuit.

3. An electrical tuned circuit comprising, in combination, an electrically conducting housing having an elongated cavity therein, said cavity having a plurality of surfaces, the one being a semicylindrical surface and the others being disposed at a distance from the axis of the first surface greater than the radius of said semicylindrical surface, an inner electrically conducting element rotatably mounted within the cavity and electrically insulated from the housing, said element having a plurality of semicylindrical portions disposed with their axes of revolution on the axis of the semicylindrical surface of the cavity with their surfaces of revolution confronting the surfaces of the cavity, at least two portions of said element being disposed on different sides of said axis.

4. An electrical tuned circuit comprising the elements of claim 3 wherein the inner electrically conducting element rotatably mounted within the housing includes at least one cylindrical portion disposed between two semicylindrical portions, and means for coupling the tuned circuit to an electrical circuit disposed on the housing adjacent to the cylindrical portion of the conducting element.

5. An electrical tuned circuit comprising the elements of claim 4 wherein the inner electrically conducting element consists of three semicylindrical portions, the center portion being approximately twice the length of the end portions, the two end portions being on the opposite side of the axis of rotation from the center portion, and the cylindrical portions being disposed between the center and end semicylindrical portions.

6. An electrical tuned circuit comprising the elements of claim 3 wherein the end semicylindrical portions of the conducting element are provided with irregular shaped ends, whereby a fixed change of resonant frequency may be more readily achieved for fixed changes in angular position of the electrically conducting element.

7. An electrical tuned circuit comprising the elements of claim 4 wherein the housing is provided with a groove confronting each cylindrical portion, said groove being disposed normal to the axis of the semicylindrical surface, thus permitting independent determination of the characteristic impedance of the constant characteristic impedance portion.

8. An electrical tuned circuit comprising, in combination: an electrically conducting housing including a semicylindrical portion, a flat base, and a plate defining a cavity within the housing; an electrically insulating rod; bearings affixed to the housing at the ends of the cavity on the axis of the semicylindrical portion thereof and journaled about the rod; an electrically conducting shell mounted upon the rod within the cavity, said shell having a plurality of semicylindrical portions, at least two of said portions being disposed on opposite sides of the rod; and means to couple an electrical circuit into the cavity.

9. An electrical tuned circuit comprising the elements of claim 8 wherein the shell consists of three semicylindrical portions and two cylindrical portions, the end semicylindrical portions being separated from the center semicylindrical portion by said cylindrical portions, the center semicylindrical portion being approximately twice the length of the end semicylindrical portions and disposed on the opposite side of the rod from the end portions, and the means to couple an electrical circuit to the cavity including coupling loops disposed adjacent to the cylindrical portions of the shell on the housing.

10. A pair of cascaded electrical tuned circuits comprising two circuits defined by the elements of claim 9, the housings of said circuits having a common plate, and the common plate being provided with an aperture confronting one of the cylindrical portions of the shell of each circuit, whereby the two circuits are coupled together.

11. An electrical tuned circuit comprising, in combination, a transmission line including an electrically conducting housing having a cavity therein, an electrically conducting rod within the housing mounted on an axis displaced from and parallel to the axis of the cavity, said housing being rotatable with respect to the rod, and at least two members having a surface conforming to the surface of the cavity, said members being mounted along the axis thereof, a portion of the surface of said members being shaped inwardly to permit the rod to be disposed therebetween, there being a gap between the rod and said latter surface which varies with rotation of the housing with respect to the rod, the minimum gap between one of the members and the rod occurring at different positions of rotation of the housing with respect to the rod than the minimum gap between the other member and the rod, and one of the gaps increasing with said rotation and the other simultaneously decreasing over at least a portion of the range of rotation, and non-dissipative termination means disposed at the ends of the transmission line.

12. An electrical tuned circuit comprising the elements of claim 11 wherein at least one of the members is provided with a cylindrical outer surface and an inner surface having a semicylindrically portion eccentrically disposed with respect to the axis of the outer surface, said inner surface also having outwardly flaring surfaces extending to the outer surface of the cylinder.

13. An electrical tuned circuit comprising, in combination, an electrically conducting housing having an aperture on one end adapted to mount a vacuum tube, a tubular electrically conducting element rotatably mounted to the housing at both ends, an electrically conducting rod mounted to the housing at one end and electrically insulated therefrom, the other end of said rod confronting the aperture and being adapted to be connected to one of the elements of a vacuum tube, said rod being disposed within the tubular element and spaced therefrom, the gaps between at least two portions of the rod and the element changing in opposite directions with rotation of the tubular element with respect to the housing, and a pair of contactless R.F. connections disposed between the ends of the tubular element and the housing, whereby D.C. potentials for the vacuum tube may be connected to the rod and housing eliminating the need for sliding contacts between the vacuum tube and the rotatable element.

14. An electrical tuned circuit comprising, in combination, a transmission line of fixed length having a first conducting element with an elongated cavity therein and a second electrically conducting element disposed within the cavity, non-dissipative termination means disposed at the ends of the transmission line, and means for simultaneously increasing the characteristic impedance of a portion of said transmission line and decreasing the characteristic impedance of another portion thereof.

15. An electrical tuned circuit comprising, in combination, a transmission line having two portions of approximately equal length, non-dissipative termination means disposed at the ends of the transmission line, and means for simultaneously increasing the characteristic impedance of one of said portions and decreasing the characteristic impedance of the other portion.

16. An electrical tuned circuit comprising the elements of claim 14 wherein the second electrically conducting element comprises a rod longitudinally disposed within the cavity in the first element, the first electrically conducting element being rotatable relative to the rod, and the means for simultaneously increasing the characteristic impedance of a portion of the transmission line and decreasing the characteristic impedance of another portion of the line varying the distances between the rod and at least two different portions of the cavity in opposite directions.

17. An electrical circuit comprising a transmission line having two elongated, spaced electrically conducting elements, the first element surrounding the second element and having at least two portions with semicylindrical surfaces confronting the second element, said portions being disposed along the axis of elongation of the elements and confronting different sides of the second element, the second element being in the form of a rod, means for rotating the first element about an axis eccentrically disposed relative to the axis of the second element, and non-dissipative termination means disposed at the ends of the transmission line.

18. An electrical tuned circuit comprising a transmission line having two elongated spaced electrically conducting elements, the first element surrounding the second element and being insulated therefrom, said first element having at least two portions with semicylindrical surfaces confronting the second element, said portions being disposed along the axis of elongation of the elements and confronting different sides of the second element, the second element being in the form of a rod, non-dissipative termination means disposed at the ends of the transmission line and means for rotating the first element about an axis eccentrically disposed relative to the axes of the semicylindrical surfaces.

19. An electrical tuned circuit comprising the elements of claim 18 wherein the means to terminate the ends of the transmission line comprise an electrical short circuit at one end of the line, and a vacuum tube at the other end thereof, said vacuum tube being coupled to the transmission line by a constant impedance portion of the transmission line.

20. An electrical tuned circuit comprising, in combination, a transmission line having two electrically conducting elements, the one element comprising a housing having an elongated cavity therein, said cavity having at least two surfaces, the one being a semicylindrical surface and the other being disposed at a distance from the axis of the first surface greater than the radius of said semicylindrical surface, and the second element of the transmission line being rotatably mounted within the cavity of the housing and electrically insulated from the housing, said second element having a plurality of semicylindrical portions disposed with their axes of revolution on the axis of the semicylindrical surface of the cavity with their surfaces of revolution confronting the surfaces of the cavity, at least two portions of the second element being disposed on opposite sides of the axis, and non-dissipative termination means disposed at the ends of the transmission line.

21. An electrical tuned circuit comprising the elements of claim 3 in combination with members of electrically conducting material extending through the housing, the ends of said members confronting the inner electrically conducting element and being adjustably spaced therefrom, whereby irregularities in the characteristic of frequency to angular displacement of the rotatable inner element may be minimized by adjustment of the space between the members and the inner electrically conducting element.

22. An electrical tuned circuit comprising, in combination, a transmission line having a first electrically conducting element with an elongated cavity therein, and a second electrically conducting element disposed within the cavity and electrically insulated from the first electrically conducting element, said second element being rotatable relative to the first element and spaced therefrom by gaps, and the gaps between at least two different portions of the elements being variable by rotation of the elements and a minimum at different rotational positions of the elements, and non-dissipative termination means disposed at the ends of the transmission line.

23. An electrical tuned circuit comprising a transmission line, non-dissipative termination means disposed at two spaced points along the transmission line, and means for increasing the characteristic impedance of one portion of the transmission line between said points and simultaneously decreasing the characteristic impedance of another portion of the transmission line between said points.

References Cited

UNITED STATES PATENTS

| | | | |
|---|---|---|---|
| 2,405,437 | 8/1946 | Leeds | 178—44 |
| 2,438,367 | 3/1948 | Keister | 333—35 XR |
| 2,445,445 | 7/1948 | Marcum | 250—40 |
| 2,523,128 | 9/1950 | MacDonald et al. | 178—44.1 |
| 2,527,608 | 10/1950 | Willoughby | 178—44.2 |
| 2,543,085 | 2/1951 | Willoughby | 333—26 |
| 2,560,685 | 7/1951 | Cooper | 178—44.1 |
| 2,561,398 | 7/1951 | Miller | 333—82 XR |
| 2,561,727 | 7/1951 | Cooper et al. | |
| 2,589,259 | 3/1952 | Isley | 178—44.1 |
| 2,597,867 | 5/1952 | Hansen | 333—35 XR |
| 2,599,905 | 6/1952 | Fano | 333—24 |

FOREIGN PATENTS

| | | |
|---|---|---|
| 599,021 | 3/1948 | Great Britain. |

ELI LIEBERMAN, *Primary Examiner.*

BENNETT G. MILLER, L. F. STOLL, S. CHATMON, Jr., *Examiners.*

UNITED STATES PATENT OFFICE
CERTIFICATE OF CORRECTION

Patent No. 3,356,971 December 5, 1967

John J. Pakan

It is hereby certified that error appears in the above numbered patent requiring correction and that the said Letters Patent should read as corrected below.

Column 2, line 40, for "l" read -- $l_1$ --; lines 41 and 48, for "Zo", each occurrence, read -- $Zo_1$ --; line 62, for "tan Bl" read -- tan $Bl_1$ --; column 3, line 1, for "Bl/2" read -- $Bl_2$ --; line 12, for "$v_{10}$" read -- v --; line 13, for "3×10" read -- $3\times10^{10}$ --; column 9, line 69, for "semicylindrically" read -- semicylindrical --.

Signed and sealed this 25th day of February 1969.

(SEAL)
Attest:

Edward M. Fletcher, Jr.
Attesting Officer

EDWARD J. BRENNER
Commissioner of Patents